United States Patent
Apelsmeier et al.

(10) Patent No.: US 11,990,697 B2
(45) Date of Patent: May 21, 2024

(54) POWER ELECTRONICS UNIT COMPRISING A CIRCUIT BOARD AND A POWER MODULE, METHOD FOR PRODUCING A POWER ELECTRONICS UNIT, MOTOR VEHICLE COMPRISING A POWER ELECTRONICS UNIT

(71) Applicant: AUDI AG, Ingolstadt (DE)

(72) Inventors: Andreas Apelsmeier, Pollenfeld (DE); Benjamin Söhnle, Ingolstadt (DE); Daniel Ruppert, Lenting (DE)

(73) Assignee: AUDI AG, Ingolstadt (DE)

( * ) Notice: Subject to any disclaimer, the term of this patent is extended or adjusted under 35 U.S.C. 154(b) by 237 days.

(21) Appl. No.: 17/623,378

(22) PCT Filed: Sep. 7, 2020

(86) PCT No.: PCT/EP2020/074923
§ 371 (c)(1),
(2) Date: Dec. 28, 2021

(87) PCT Pub. No.: WO2021/052795
PCT Pub. Date: Mar. 25, 2021

(65) Prior Publication Data
US 2022/0368044 A1  Nov. 17, 2022

(30) Foreign Application Priority Data
Sep. 18, 2019 (DE) .......... 102019125108.7

(51) Int. Cl.
*H01R 12/58* (2011.01)
*H01R 12/52* (2011.01)
(Continued)

(52) U.S. Cl.
CPC ............. *H01R 12/58* (2013.01); *H01R 12/52* (2013.01); *H05K 1/18* (2013.01); *H05K 3/308* (2013.01);
(Continued)

(58) Field of Classification Search
CPC ........ H01R 12/58; H01R 12/52; H01R 12/57; H05K 1/18; H05K 3/308;
(Continued)

(56) References Cited

U.S. PATENT DOCUMENTS

| | | | |
|---|---|---|---|
| 7,294,007 B1 | 11/2007 | Lawlyes | |
| 11,756,868 B2 * | 9/2023 | Kubouchi | H01L 21/4853 257/773 |
| 2010/0127383 A1 * | 5/2010 | Oka | H01L 24/40 257/692 |

FOREIGN PATENT DOCUMENTS

| | | |
|---|---|---|
| CN | 107403793 A | 11/2017 |
| DE | 10024377 A1 | 11/2001 |

(Continued)

OTHER PUBLICATIONS

International Search Report (with English Translation) issued on Feb. 5, 2021 in corresponding International Patent Application No. PCT/EP2020/074923; 8 pages.

(Continued)

*Primary Examiner* — Andargie M Aychillhum
(74) *Attorney, Agent, or Firm* — Maier & Maier, PLLC

(57) ABSTRACT

Power electronics arrangement including a printed circuit board and at least one power module fastened on the printed circuit board, which has one or more electronic components potted by a potting compound. At least one module connecting point of the power module is electrically contacted with at least one board connecting point of the printed circuit board by an electrically conductive pin. A base section of the (Continued)

pin is fastened on the module connecting point or on the board connecting point, and the end of the pin opposite to the base section is pressed in the installation position into a contacting opening assigned or assignable to the respective other connecting point.

10 Claims, 2 Drawing Sheets

(51) Int. Cl.
  *H05K 1/18* (2006.01)
  *H05K 3/30* (2006.01)
  *H01R 12/57* (2011.01)
(52) U.S. Cl.
  CPC .... *H01R 12/57* (2013.01); *H05K 2201/10015* (2013.01); *H05K 2201/10166* (2013.01); *H05K 2201/10318* (2013.01); *H05K 2201/10378* (2013.01); *H05K 2201/1059* (2013.01)
(58) Field of Classification Search
  CPC .......... H05K 2201/10166; H05K 2201/10318; H05K 2201/10015

USPC .......................................................... 361/773
See application file for complete search history.

(56) References Cited

FOREIGN PATENT DOCUMENTS

| DE | 102007029678 A1 | 7/2008 | |
|---|---|---|---|
| DE | 102009055648 A1 * | 7/2010 | ............. H01L 24/37 |
| DE | 102009055648 A1 | 7/2010 | |
| DE | 102017207382 A1 | 11/2017 | |
| DE | 102017212739 A1 | 1/2019 | |
| EP | 1906717 A2 | 4/2008 | |
| EP | 2765840 A2 | 8/2014 | |
| EP | 3404774 A1 | 11/2018 | |

OTHER PUBLICATIONS

International Preliminary Report on Patentability with English translation issued on Mar. 15, 2022, in corresponding International Application No. PCT/EP2020/074923; 22 pages.

Office Action issued on Feb. 29, 2024, in corresponding Chinese Application No. 202080065046.5, 14 pages.

* cited by examiner

POWER ELECTRONICS UNIT COMPRISING A CIRCUIT BOARD AND A POWER MODULE, METHOD FOR PRODUCING A POWER ELECTRONICS UNIT, MOTOR VEHICLE COMPRISING A POWER ELECTRONICS UNIT

FIELD

The invention relates to a power electronics arrangement comprising a printed circuit board and at least one power module fastened on the printed circuit board, which has one or more electronic components potted by means of a potting compound, wherein at least one module connecting point of the power module is electrically contacted with at least one board connecting point of the printed circuit board by means of an electrically conductive pin, wherein a base section of the pin is fastened on the module connecting point or on the board connecting point and the end of the pin opposite to the base section is pressed in the installed position into a contacting opening assigned or assignable to the respective other connecting point. The invention furthermore relates to a method for producing a power electronics arrangement and a motor vehicle comprising a power electronics arrangement.

BACKGROUND

With respect to the contacting of the electrical connections of the power module on a printed circuit board which comprises, for example, a driver circuit assigned to the power module, multiple contacting concepts are known from the prior art. The two contacting concepts described hereinafter are used in particular in molded power modules. Molded is to be understood here as a synonym for electronic components of the power module, in particular transistors and/or capacitors or the like, being potted by means of the potting compound.

It is thus provided in a first contacting concept that laterally protruding and L-shaped contacting pins of the power module pointing in the same direction are soldered on the printed circuit board. However, multiple problems occur with respect to this selective soldering. Thus, for example, problems often occur in conjunction with a sufficient solder filling, which can result, for example, in inadequate electrical contacting. Furthermore, the soldering process is linked to the occurrence of further manufacturing costs, since corresponding soldering devices and the like are required for this purpose. A further problem with respect to the soldered connections is that the soldered points typically represent mechanical weak points of the system, which are susceptible to failure in particular with respect to vibrations. The service life of the system can be significantly reduced in this way. Very fundamentally, the soldered points of power electronics arrangements are not to be subjected to excessively high mechanical strains.

In a further contacting concept, the so-called press-fit connection is used. In this case, the power modules have laterally protruding and L-shaped contacting pins pointing in the same direction. The contacting pins are pressed into the printed circuit board or corresponding contacting points of the printed circuit board, whereby the electrical connections are formed. It is necessary for this purpose that the power module is aligned during the pressing in with respect to the printed circuit board by means of a corresponding tool, wherein a support of the pins by means of a suitable pressing-in support is required during the pressing in. To enable this support of the pins, they typically have laterally protruding shoulders, on which the pressing-in support presses or acts during the pressing in. The shoulders are usually arranged directly adjacent to the section of the pin which is pressed into the contacting point in order to avoid bending or buckling of the pins caused by the pressing force.

In both above-described contacting concepts, high demands result on the tolerance with respect to the alignment of the contacting or signal pins. Both the selective soldering and also the pressing in are only possible when these high tolerance demands are met.

In addition to the above-explained contacting concepts, further specific concepts with respect to electrical contacts and power electronics arrangements are known from the prior art. Thus, for example, a semiconductor component having a first carrier part and a second carrier part is known from DE 10 2017 212 739 A1. The carrier parts, between which semiconductor elements are arranged or pressed in, implement a housing functionality of the semiconductor component. The semiconductor elements are electrically connected to the carrier parts via wires in the region of contact surfaces of the carrier parts. To connect the first carrier part to the second carrier part, a press-fit connection implemented by means of a contact sleeve and a contact pin is provided, which moreover forms an electrical connection between the two carrier parts.

A circuit arrangement having a printed circuit board and electrical components arranged on the printed circuit board is known from EP 2 765 840 A2. Electrically conductive connection pins protruding out of a housing of the component are connected by means of a solder layer to conductor tracks of the printed circuit board. The printed circuit board moreover has a recess in which a part of the housing of the component is arranged. The dimensions of the housing or the recess are selected in particular in such a way that the housing is pressed into the recess.

SUMMARY

The underlying object of the invention is to specify an improved concept for electrically contacting molded power modules on associated printed circuit boards, in particular with respect to a simplified production process and improved mechanical properties.

The object is achieved according to the invention in a power electronics arrangement of the type mentioned at the outset in that the pin extends linearly from the module connecting point to the board connecting point in the installation position and is arranged perpendicularly to the printed circuit board surface, wherein the pin is supported on a buttress section that is formed from the potting compound and has the module connecting point.

The concept of the present invention is to optimize and refine the electrical contacting by means of a press-fit connection explained at the outset. Due to the linear course of the pin from the module connecting point to the board connecting point and the fact that the pin is supported by the buttress section, it can be quasi-clamped between the module connecting point and the board connecting point. Moreover, because of the fact that the pin is pressed into the contacting opening, on the one hand, and is fastened on the corresponding connecting point, in particular by means of an adhesive bond or welded bond, on the other hand, a stable, reliable electrical contact that significantly increases the service life of the power electronics arrangement is implemented. With respect to the fastening of the power module on the printed circuit board, in particular a screw connection or adhesive bond or the like can be provided, from which a further increase of the mechanical stability results in the power electronics arrangement.

The linear course of the pin, which is perpendicular with respect to the printed circuit board surface and therefore also with respect to the power module surface, moreover enables with respect to the production method, which will be described in more detail later, that the pressing in by means of a pressing stamp, for example, is enabled in such a way that the pressing force only acts on the surface of the power module. During the pressing of the pin into the contacting opening, in the case of which high pressing-in forces are typically required, the forces acting inside the pin are exclusively transmitted along the longitudinal direction of the pin. Bending or buckling of the pin, as frequently occurs with angled connecting pins, for example, is thus avoided.

A further advantage in the present invention with respect to the press-fit contacting concept from the prior art explained at the outset, is that a tool required for support on the pin or a pressing in support is not required during the pressing in. While in the contacting concept explained at the outset, bending of the pins can only be avoided by the use of corresponding pressing-in tools, for example, pressing-in supports, this problem no longer occurs in the present invention due to the linear force transmission through the pin. Instead, it is thus only necessary that the power module is pressed against the printed circuit board in the direction perpendicular to the printed circuit board surface, whereby the press-fit connections and therefore the electrical contacts are formed accordingly. As already explained, for this purpose the pressing force can be applied, for example, by means of a suitable pressing stamp in a conceivably simple manner solely to the surface of the power module.

A further advantage of the present invention is that soldered connections are no longer required at all to form the electrical contacts, whereby all problems explained in conjunction with this contacting concept are therefore also dispensed with. Instead, such high levels of friction typically arise during the pressing-in process that homogeneous cold welding occurs between the pin and a pressing-in sleeve, which will also be described in detail later. This contacting has significantly higher mechanical stability and lower transition resistance in comparison to a soldered connection.

The power module and/or the printed circuit board can also have multiple connecting points which are contacted with one another by means of multiple pins. The press-fit connections are expediently formed here at the same time during the same pressing process.

With respect to the potting of the electronic components of the power module by means of a potting compound, this can be a suitable plastic. Plastics made of polyamide and/or polyurethane and/or epoxy resin come into consideration for this purpose. The electronic components, such as transistors, diodes, capacitors, or the like, are encased or encapsulated by means of the potting compound, whereby the electronic components are protected from undesired external influences such as mechanical stresses or moisture or the like. An additional housing of the power module is therefore no longer absolutely required.

In one preferred embodiment, the buttress section is formed as a laterally protruding projection. The power module can thus be formed as an essentially cuboid or plate-shaped component, which has a corresponding protrusion. The pin can be quasi-clamped between the side of the projection facing toward the printed circuit board and the printed circuit board surface, wherein the pin is moreover fixed by means of the fastening on the one connecting point and by means of the press-fit connection on the respective other connecting point. The clamping force applied by the buttress section causes a corresponding counterforce caused by the printed circuit board here. Since both the substrate of the printed circuit board and also the filler compound forming the buttress section are each typically integral solid bodies, mechanical stability or strength of the components participating in this case sufficient for securely fixing the pin is ensured.

The module connecting point can be a contact surface arranged on a circuit board of the power module, wherein the circuit board is potted in the potting compound, which is left out in the region of the module connecting point. The circuit board of the power module preferably has a copper surface applied to a substrate, which forms the module connecting point, wherein this copper surface is accordingly left out during the potting of the electronic components or the circuit board of the power module. The circuit board preferably moreover carries and contacts the electronic components of the power module.

The contacting opening can be an opening of the board connecting point. The board connecting point is, for example, a planar connecting point which is arranged superficially on the printed circuit board, in particular a conductor track of the printed circuit board. The board connecting point is preferably a layer made of copper or another suitable metal or electrical conductor.

In a further embodiment, the contacting opening is an opening of the module connecting point. Although, as explained above, the module connecting point can be a contact surface arranged on the circuit board of the power module, in principle, the module connecting point can very generally be a contacting point arranged externally on the potting compound, for example a copper layer or the like.

It is conceivable that a contacting opening is both an opening of the board connecting point and also the module connecting point, wherein then grouting on both sides is possible.

The contacting opening can be provided as a drilled hole in the region of the board connecting point or the module connecting point. The contacting opening can extend up into the substrate of the printed circuit board or the circuit board. If the contacting opening is in the region of the module connecting point, it can possibly even extend up into the potting compound. Preferably, the pressing-in sleeve is inserted and fastened in the contacting opening, which is deformed or widened during the pressing in of the pin, wherein the press-fit connection is implemented here.

With respect to the specific geometric design of the pin, it can be provided that its base section is arranged at an angle, namely preferably at a right angle, to the section of the pin which extends from the module connecting point to the board connecting point. In other words, the pin can be formed L-shaped. In this way, on the one hand, a stable fastening of the base section at the respective connecting point and, on the other hand, the course of the pin perpendicular to the printed circuit board surface are enabled. At the end of the pin opposite to its base section, it can be widened in the region in which the pin forms the press-fit connection with the pressing-in sleeve, wherein it can in turn taper to a point. Insertion of the pin into the pressing-in sleeve without problems is enabled in this way. Alternatively, the pin can also solely be formed cylindrical at its end opposite to the base section.

The invention moreover relates to a method for producing a power electronics arrangement, wherein a printed circuit board and at least one power module, which has one or more electronic components potted by means of a potting compound, are used, wherein a base section of an electrically conductive pin is fastened on either a module connecting point of the power module or on a board connecting point of the printed circuit board, wherein then the power module is moved toward the printed circuit board or vice versa and at the same time the end of the pin opposite to the base section is pressed into a contacting opening assigned or assignable to the respective other connecting point and in this way an electrical contact of these connecting points is implemented, wherein the pin extending linearly from the module connecting point to the board connecting point and arranged perpendicularly to the printed circuit board surface is supported on a buttress section formed from the potting compound and having the module connecting point.

All features and advantages explained in conjunction with the power electronics arrangement according to the invention are applicable to the method according to the invention and vice versa.

The underlying object of the invention is furthermore achieved in a power electronics arrangement of the type mentioned at the outset in that the end of the pin opposite to the base section is a linear end section extending parallel to the printed circuit board surface, wherein the contacting opening is arranged on a contact component protruding laterally from the printed circuit board or the power module.

This power electronics arrangement thus has the underlying concept that to form the press-fit connection or to press the pin into the contacting opening, the power module is not moved perpendicular to the printed circuit board, but instead parallel thereto. Because a press-fit connection is also implemented here, in which only a lateral movement of the power module in relation to the printed circuit board is required for the pressing in, the necessity of more complicated pressing-in tools or supports is also dispensed with here, as already explained above. The further disadvantages mentioned above in conjunction with soldered connections are also resolved here.

The pin can in particular protrude laterally from the power module and can be angled multiple times in its further course. In particular, the pin can have an angled U shape. The lateral protrusion of the pin is expedient in particular because a lateral protrusion is already predefined as a preferred direction of the pin by the potting tool, in particular by corresponding molds, of the potting compound. The pin can extend here up into the interior of the potting compound, wherein the module connecting point and the base section of the pin are arranged inside the power module or the potting compound.

Furthermore, in this power electronics arrangement, pressing of the pin into the contacting opening by means of a pressing stamp acting laterally, in particular directly on the pin, is enabled. This is expedient if further components are arranged on the side of the power module facing away from the printed circuit board, which make pressing in from this direction more difficult or even impossible.

In one preferred embodiment, the contact component is made plate-shaped or cuboid. The contact component can be fastened on the module connecting point or on the board connecting point, for example by means of an electrically conductive adhesive or the like. The contacting opening can be a drilled hole in the contact component extending parallel to the printed circuit board surface. Moreover, a pressing-in sleeve is preferably provided in the contacting opening, which is deformed accordingly upon pressing in of the pin to form the electrical contact.

The invention moreover relates to a method for producing a power electronics arrangement, wherein a printed circuit board and at least one power module, which has one or more electronic components potted by means of a potting compound, are used, wherein a base section of an electrically conductive pin is fastened on either a module connecting point of the power module or on a board connecting point of the printed circuit board, wherein then the power module is moved along the printed circuit board surface or vice versa, and at the same time the end section of the pin, which faces away from the base section, is linear, and extends parallel with respect to the printed circuit board surface, is pressed into a contacting opening assigned or assignable to the respective other connecting point, which is arranged on a contact component protruding laterally from the printed circuit board or the power module, wherein an electrical contact of these connecting points is implemented in this way.

All features and advantages explained in conjunction with the power arrangement according to the invention are also applicable to the method according to the invention and vice versa here.

Moreover, the invention relates to a motor vehicle comprising a power electronics arrangement according to the preceding description. The power electronics arrangement is preferably provided for inverting a DC voltage provided by an energy storage device of the motor vehicle. The motor vehicle is preferably an electric or hybrid vehicle here. All features and advantages explained in conjunction with the power arrangement according to the invention are transferable to the motor vehicle according to the invention.

All features and advantages explained in conjunction with the power electronics arrangements according to the invention or methods according to the invention are transferable to the motor vehicle according to the invention.

BRIEF DESCRIPTION OF THE FIGURES

Further advantages and details of the invention result from the exemplary embodiments described hereinafter in the figures. In the schematic figures.

DETAILED DESCRIPTION

Figure 1:
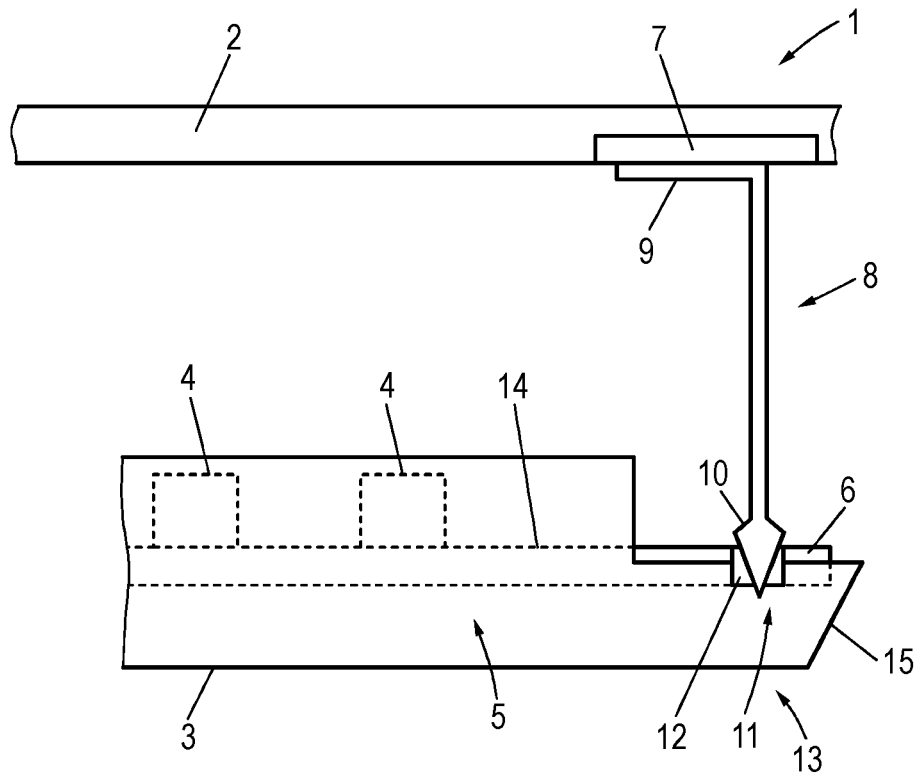
FIG. 1 shows a schematic illustration of a first exemplary embodiment of a power electronics arrangement according to the invention.

FIG. 1 shows a first exemplary embodiment of a power electronics arrangement 1 according to the invention having a printed circuit board 2 and a module 3 fastened on the printed circuit board 2. The power module 3 has multiple electronic components 4, which are potted by means of a potting compound 5 and therefore encapsulated in the potting compound 5 or encased thereby. The electronic components 4 are, for example, transistors, capacitors, and further components required for implementing a power module 3, which are interconnected with one another accordingly. The printed circuit board 2 comprises a driver circuit (not shown in greater detail here) for the power module 3. The power electronics arrangement 1 is part of a circuit arrangement, in particular a control unit, of a motor vehicle, which is used in the context of an inversion of a DC voltage provided by an energy storage device of the motor vehicle.

A module connecting point 6 of the power module 3 is electrically contacted with a board connecting point 7 of the printed circuit board 2. This contact takes place by means of a press-fit connection of an electrically conductive pin 8, which has an L-shaped geometry and a diameter of 0.8 mm by way of example. A base section 9 of the pin 8 is fastened here on the board connecting point 7, for example, by means of an electrically conductive adhesive or a weld.

The end 10 opposite to the base section 9 of the pin 8 is pressed in the installation position shown in FIG. 1 into a contacting opening 11 assigned to the module connecting point 6. In the region of the contacting opening 11, a pressing-in sleeve 12 is inserted for this purpose, which is widened or deformed upon the pressing in and therefore is in electrical contact with the module connecting point 6. The end 10 of the pin 8 opposite to the base section 9 is, for example, first widened and tapers toward its point. Alternatively, the end 10 of the pin can also solely be made cylindrical.

As is apparent from FIG. 1, the pin 8 extends in the installation position linearly from the module connecting point 6 to the board connecting point 7 and is arranged here perpendicular to the surface of the printed circuit board 2 and therefore also to the power module surface. The pin 8 is supported on a buttress section 13, which is formed from the potting compound 5 and has the module connecting point 6. Therefore, the pin 8 is not only fixed in its position by means of the fastening on the board connecting point 7 and the press-fit connection on the module connecting point 6, but rather it is moreover clamped between the module connecting point 6 or the buttress section 13 and the board connecting point 7 or the printed circuit board 7. A mechanically stable electrical contact between the connecting points 6, 7 is implemented in this way.

Although only a single pin 8 is provided in FIG. 1 and also in each of all further exemplary embodiments, multiple pins 8 can also be provided for contacting multiple connecting points 6, 7, wherein simultaneous pressing in of these pins 8 is expedient.

An improved option for electrical contacting of the printed circuit board 2 with the power module 3 in relation to the concepts known from the prior art is indicated by the power electronics arrangement 1.

Thus, for example, disadvantages are overcome which typically occur in the case of soldered connections. This relates in particular to saving production costs arising due to the soldering process and avoiding mechanical weak points arising due to the soldered connection and possibly deficient solder filling. The power electronics arrangement 1 also has advantages over press-fit concepts known from the prior art. Special or complicated pressing-in tools or supports are thus typically required for this purpose in the prior art, which are not necessary during the installation of the power electronics arrangement according to the invention. With respect to FIG. 1, the pressing of the pin 8 into the pressing-in sleeve 12 is effectuated by means of an application of force by a pressing tool such as a pressing stamp or the like from below on the potting compound 5 of the power module 3. Because the pin 8 extends linearly between the module connecting point 6 and the board connecting point 7 and is moreover supported by the buttress section 13, the force within the pin 8 is exclusively transmitted in the longitudinal direction during the pressing in. Undesired buckling or bending of the pin 8 is avoided in this way.

A corresponding suitable plastic is provided as the potting compound 5, for example, based on polyamide or the like. Due to the encasing or encapsulation of the electronic components 4 of the power module 3 by the potting compound 5, protection is ensured from negative influences from the outside, for example, from mechanical strains or moisture or the like. A separate housing is accordingly not required in the power module 3.

The board connecting point 7 is, for example, a copper layer, which is applied to the surface of a substrate of the printed circuit board 2. The board connecting point 7 can be a part of a conductor track applied to the substrate of the printed circuit board 2.

The module connecting point 6 is a contact surface arranged on a circuit board 14 of the power module 3. Specifically, the module connecting point 6 is formed as a copper layer which is applied to the surface of a substrate of the circuit board 14. The circuit board 14 potted in the potting compound 5 carries and moreover contacts the electronic components 4 of the power module, wherein the potting compound 5 is left out in the region of the module connecting point 6. This has the result that the module connecting point 6 is exposed to the outside.

As is also apparent from FIG. 1, the buttress section 13 is formed as a laterally protruding projection 15. The projection 15 has a sufficiently high thickness or strength to be able to withstand the clamping force of the pin 8. One particular advantage of the projection 15, however, is that it ensures a secure support of the pin 8 during the pressing-in process. In the region of the buttress section 13, the contacting opening 11 provided as a drilled hole penetrates the module connecting point 6, the substrate of the circuit board 14, and the material of the potting compound 5 arranged below this.

Figure 2:
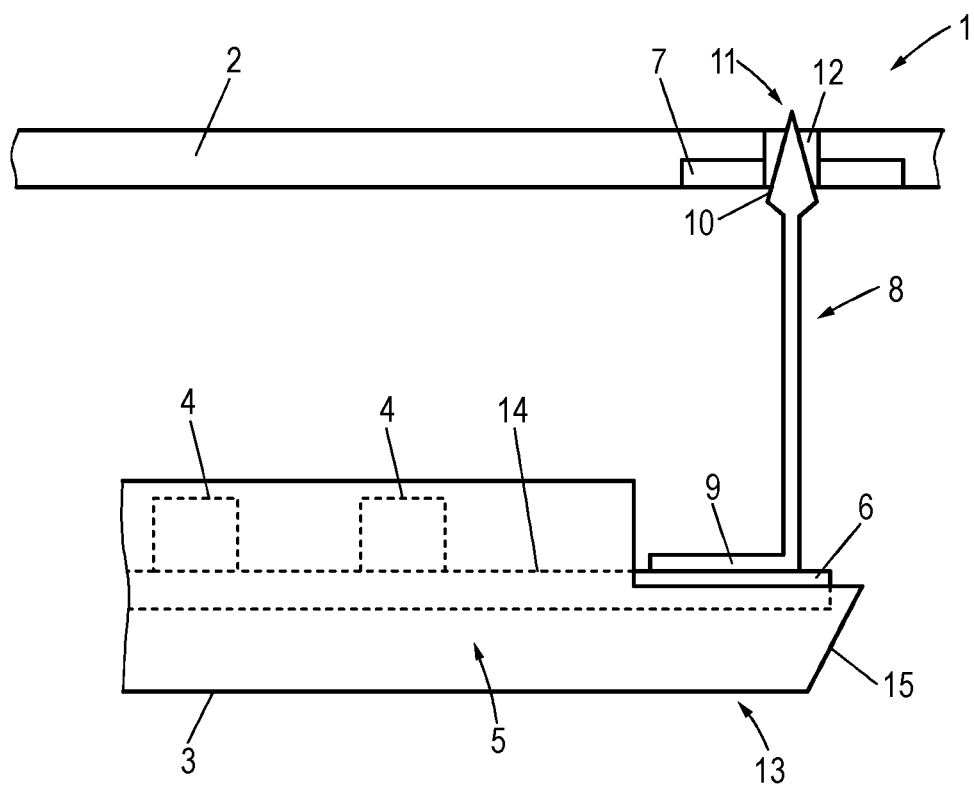
FIG. 2 shows a schematic illustration of a second exemplary embodiment of a power electronics arrangement according to the invention.

FIG. 2 shows a second exemplary embodiment of a power electronics arrangement according to the invention, wherein identical reference signs are used for identical components. With respect to the exemplary embodiment of a power electronics arrangement 1 illustrated in FIG. 1, the power electronics arrangement 1 shown in FIG. 2 differs in that the base section 9 of the pin 8 is not fastened on the board connecting point 7, but rather on the module connecting point 6. The end 10 of the pin 8 opposite to the base section 9 is therefore pressed into the contacting opening 11 assigned to the plate connecting point 7 in the installation position shown in FIG. 2. The pressing-in sleeve 12, which is in electrical contact with the plate connecting point 7, is inserted into a drilled hole penetrating the plate connecting point 7 and the substrate of the printed circuit board 2. Otherwise, the features of the power electronics arrangement 1 explained in conjunction with FIG. 1 apply similarly to the power electronics arrangement 1 from FIG. 2.

The method for producing the exemplary embodiments of the power electronics arrangements 1 shown in FIGS. 1 and 2 is described hereinafter. Firstly, the base section 9 of the pin 8 is fastened on the connecting point 6, 7. An electrically conductive adhesive or a welded bond can be used for this purpose. Multiple connecting points 6, 7 can possibly also each be equipped with a pin 8. The power module 3 is subsequently moved toward the printed circuit board 2, wherein the pin 8 is pressed at its end 10 opposite to the base section 9 into the contacting opening 11 assigned to the respective other connecting point 6, 7 or a pressing-in sleeve 12 arranged in the contacting opening 11. The pressing-in sleeve 12 is deformed here in such a way that a stable electrical contact is formed between the module connecting point 6 and the board connecting point 7 in this way. This pressing-in process can be carried out in particular by means of a pressing stamp, which approaches toward the power module 3 from below with respect to the arrangements shown in FIGS. 1 and 2. Since the pin 8 extends here linearly from the module connecting point 6 to the board connecting point 7 and is arranged perpendicularly to the printed circuit board surface and moreover is supported on the buttress section 13 formed from the potting compound 5 and having the module connecting point 6, the pressing-in force acts in the longitudinal direction of the pin 8, whereby bending or buckling of the pin 8 during the pressing in is avoided. As soon as the power module 3 has arrived in the final installation position, it is fastened on the printed circuit board 2 by means of a screw connection or adhesive bond.

Figure 3:
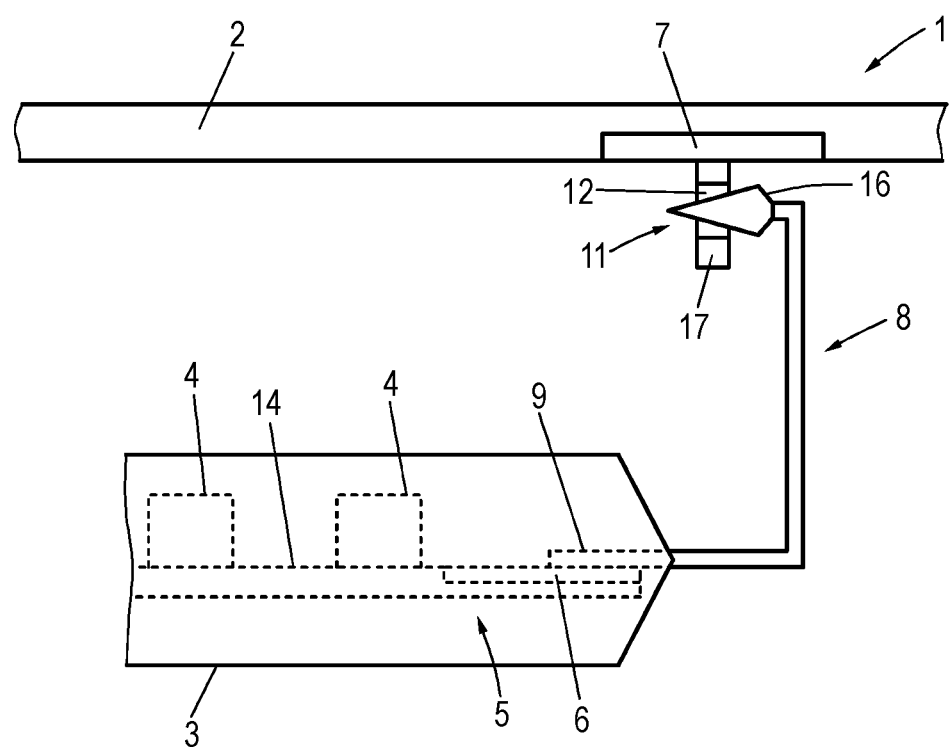
FIG. 3 shows a schematic illustration of a third exemplary embodiment of a power electronics arrangement according to the invention.

FIG. 3 shows a third exemplary embodiment of a power electronics arrangement 1 according to the invention, wherein identical reference signs apply for identical components. The features explained in conjunction with the exemplary embodiments shown in FIGS. 1 and 2 fundamentally apply similarly to the power electronics arrangement 1 shown in FIG. 3. One difference, however, is that in the power electronics arrangement 1 in FIG. 3, the end 16 of the pin 8 opposite to the base section 9 is a linear end section extending parallel to the printed circuit board surface, wherein the contacting opening 11 is arranged on a contact component 17 protruding laterally from the printed circuit board 2 or the power module 3.

In contrast to the exemplary embodiments shown in FIGS. 1 and 2, the exemplary angled and U-shaped pin 8 in FIG. 3 exits laterally from the potting material 5 of the power module 3. The module connecting point 6 is a contact surface arranged on a circuit board 14 of the power module 3, which is arranged inside the power module 3 and/or potted by the potting compound 5. The base section 9 of the pin 8 is also arranged inside the power module 3 and fastened there on the module connecting point 6. It is similarly conceivable that the potting compound 5 is left out in the region of module connecting point 6 as in the exemplary embodiments shown in FIGS. 1 and 2 and the module connecting point 6 is exposed.

The contact component 17 is a plate-shaped or cuboid component, which is electrically conductive and is fastened on the board connecting point 7, for example, by means of an electrically conductive adhesive or a weld or the like and is thus in electrical contact. The contacting opening 11 is a drilled hole in the contact component 17 extending parallel to the printed circuit board surface. The pressing-in aid 12 is inserted into the contacting opening 11. The pressing in of the pin 8 or the end 16 of the pin 8 opposite to the base section 9 can take place in the exemplary embodiment shown in FIG. 3 in that the power module 3 is moved from right to left with respect to the printed circuit board 2.

The method for producing the power electronics arrangement 1 from FIG. 3 is described hereinafter. First, the base section 9 of the pin 8 is fastened on the module connecting point 6, which is inside the power module 3 in FIG. 3. This typically takes place before the power module 3 is potted using the potting compound 5. The power module 3 is subsequently moved along the printed circuit board surface, wherein the end section 16 of the pin 8, which faces away from the base section 9, is linear, and extends parallel with respect to the printed circuit board surface, is pressed into the contacting opening 11 assigned to the plate connecting point 7. The contacting opening 11 is arranged here on the contact component 17 protruding laterally from the printed circuit board 2. Due to the deformation of the pressing-in sleeve 12 occurring during the pressing in, the electrical contact is formed between the module connecting point 6 and the plate connecting point 7. As soon as the power module 3 has arrived in the final installation position, it is fastened on the printed circuit board 2 by means of a screw connection or adhesive bond.

With respect to the exemplary embodiment shown in FIG. 3, it is also conceivable that the contact component 17 is arranged laterally on the module connecting point 6. In this case, the contacting opening is assigned to the module connecting point 6, wherein the base section 9 of the pin 8 is fastened on the plate connecting point 7.

The invention claimed is:

1. A power electronics arrangement, comprising:
  a printed circuit board and
  at least one power module fastened on the printed circuit board, wherein the at least one power module has one or more electronic components potted by a potting compound, wherein at least one module connecting point of the at least one power module is electrically contacted with at least one board connecting point of the printed circuit board by an electrically conductive pin, wherein a base section of the electrically conductive pin is fastened on the module connecting point of the at least one power module or on the board connecting point of the printed circuit board, and the end of the electrically conductive pin opposite to the base section, in the installation position, is configured to be pressed, while the at least one power module moves relative to the printed circuit board, into a contacting opening assigned or assignable to the respective other connecting point to implement an electrical contact of these connecting points, wherein the electrically conductive pin, in the installation position, extends linearly from the module connecting point to the board connecting point and is arranged perpendicularly to the printed circuit board surface, wherein the electrically conductive pin is supported on a buttress section that is formed from the potting compound and has the module connecting point.

2. The power electronics arrangement as claimed in claim 1, wherein the buttress section is formed as a laterally protruding projection.

3. The power electronics arrangement as claimed in claim 2, wherein the module connecting point is a contact surface arranged on a circuit board of the at least one power module, wherein the circuit board is potted in the potting compound, which is left out in the region of the module connecting point.

4. The power electronics arrangement as claimed in claim 1, wherein the module connecting point is a contact surface arranged on a circuit board of the at least one power module, wherein the circuit board is potted in the potting compound, which is left out in the region of the module connecting point.

5. The power electronics arrangement as claimed in claim 4, wherein the contacting opening is an opening of the board connecting point and/or the module connecting point.

6. The power electronics arrangement as claimed in claim 1, wherein the contacting opening is an opening of the board connecting point and/or the module connecting point.

7. The power electronics arrangement as claimed in claim 6, wherein the contacting opening is an opening of the board connecting point and/or the module connecting point.

8. A method for producing a power electronics arrangement, wherein a printed circuit board and at least one power module, which has one or more electronic components potted by means of a potting compound is used, wherein a base section of an electrically conductive pin is fastened on either a module connecting point of the at least one power module or on a board connecting point of the printed circuit board, wherein the at least one power module is then moved toward the printed circuit board or vice versa and, at the same time, the end of the electrically conductive pin opposite to the base section is pressed into a contacting opening assigned or assignable to the respective other connecting point and an electrical contact of these connecting points is implemented in this way, wherein the electrically conductive pin extending linearly from the module connecting point to the board connecting point and arranged perpendicularly to the printed circuit board surface is supported on a buttress section that is formed from the potting compound and has the module connecting point.

9. A power electronics arrangement, comprising:
a printed circuit board and
at least one power module fastened on the printed circuit board, wherein the at least one power module has one or more electronic components potted by a potting compound, wherein at least one module connecting point of the at least one power module is electrically contacted with at least one board connecting point of the printed circuit board by an electrically conductive pin, wherein a base section of the electrically conductive pin is fastened on the module connecting point of the at least one power module or on the board connecting point of the printed circuit board, and the end of the electrically conductive pin opposite to the base section, in the installation position, is configured to be pressed, while the at least one power module moves relative to the printed circuit board, into a contacting opening assigned or assignable to the respective other connecting point to implement an electrical contact of these connecting points, wherein the end of the electrically conductive pin opposite to the base section is a linear end section extending parallel to the printed circuit board surface, wherein the contacting opening is arranged on a contact component protruding laterally from the printed circuit board or the at least one power module.

10. The power electronics arrangement as claimed in claim 9, wherein the contact component is plate-shaped or cuboid.

* * * * *